United States Patent [19]

Marquardt

[11] Patent Number: 4,767,948

[45] Date of Patent: Aug. 30, 1988

[54] METHOD AND DEVICE FOR DRIVING SEMICONDUCTOR POWER COMPONENTS

[75] Inventor: Rainer Marquardt, Erlangen, Fed. Rep. of Germany

[73] Assignee: Siemens Aktiengesellschaft, Berlin and Munich, Fed. Rep. of Germany

[21] Appl. No.: 840,696

[22] Filed: Mar. 18, 1986

[30] Foreign Application Priority Data

Apr. 12, 1985 [DE] Fed. Rep. of Germany ....... 3513170

[51] Int. Cl.⁴ .................. H03K 17/60; H03K 3/01
[52] U.S. Cl. .................................. 307/270; 307/255; 307/648; 307/296 R
[58] Field of Search ............... 307/252, 270, 300, 255, 307/296 R, 252 W, 252 V, 648, 296.1; 330/265

[56] References Cited

U.S. PATENT DOCUMENTS

| | | | |
|---|---|---|---|
| 3,852,620 | 12/1974 | Milberger | 307/300 |
| 4,281,378 | 7/1981 | Ogino et al. | 307/252 C |
| 4,293,779 | 10/1981 | Nestler et al. | 307/252 C |
| 4,318,011 | 3/1982 | Zeis | 307/300 |
| 4,597,038 | 6/1986 | Stacey | 307/252 C |

FOREIGN PATENT DOCUMENTS 2913974 10/1980 Fed. Rep. of Germany .
57-126270 8/1982 Japan .

Primary Examiner—Stanley D. Miller
Assistant Examiner—B. P. Davis
Attorney, Agent, or Firm—Kenyon & Kenyon

[57] ABSTRACT

Control power for driving semiconductor power components is transmitted by means of a pulse sequence. The same pulse sequence also contains the control information which has been impressed thereon by modulation. During transmission, the potentials of the control power and control information are separated by a transformer. The pulse sequence is subsequently rectified and demodulated after the potential-separated transmission. The recovered control information is then delivered to the components after demodulation.

12 Claims, 1 Drawing Sheet

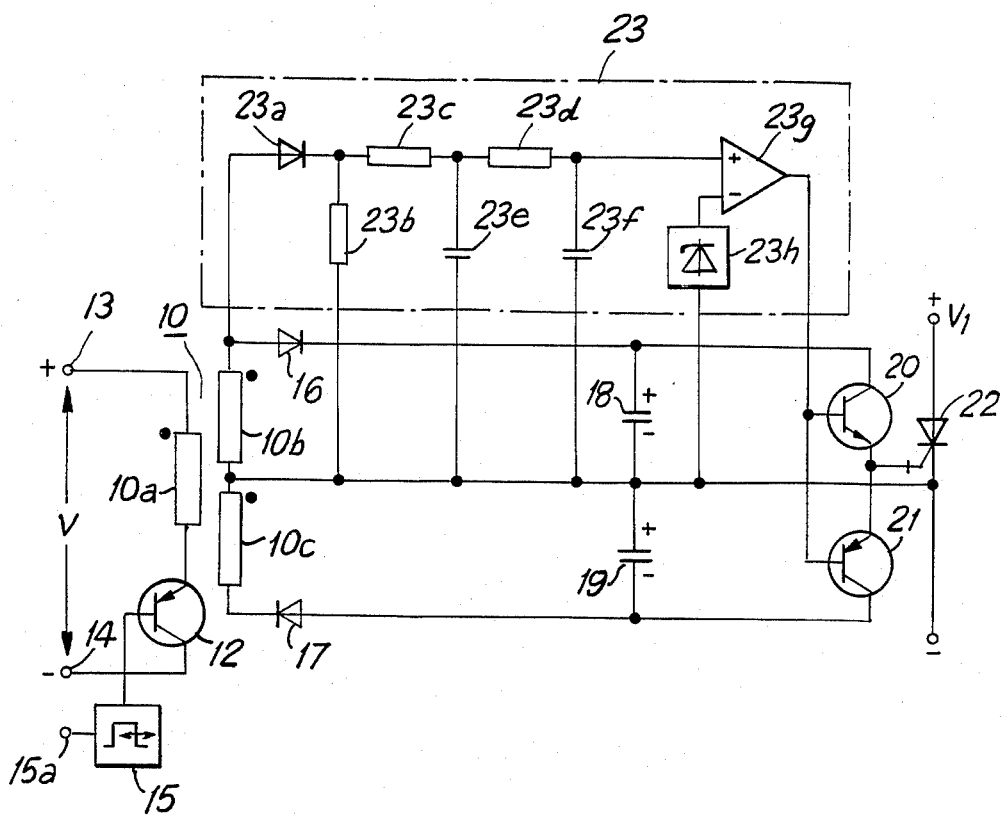

METHOD AND DEVICE FOR DRIVING SEMICONDUCTOR POWER COMPONENTS

TECHNICAL FIELD

The invention relates to a method and device for driving semiconductor power components. In particular, the invention relates to a method and a device that transmits, via the same pulse sequence, the control power and control information for driving semiconductor power components.

BACKGROUND OF THE INVENTION

The control of semiconductor power components used in power electronics equipment generally requires a separation of potentials to insulate the control section from the power section. In conventional thyristors used as semiconductor power components, the potential separation is accomplished by means of a pulse transformer which feeds the control current directly to the gate-cathode path, i.e., the control path of the thyristor. In power transistors and thyristors which can be disconnected on the control current side, i.e., GTO thyristors, the cost for potential-separated control has risen sharply. In general, control currents in pulse form of both polarities are required, for instance, a positive pulse for switching on and a negative pulse for switching off the semiconductor power component. In addition, the control currents and voltages, respectively, must be present during the "on" and "off" times of the semiconductor power component, for instance, a positive control current during the "on" time and a negative control voltage during the "off" time.

Japanese patent No. A 57-12 62 70(A) discloses device in which one of the secondary windings of a first transformer is connected via rectifiers directly to the gate-cathode path of a GTO thyristor. The positive control current is fed-in during the "on" time via this first secondary winding. Via the second secondary winding, a capacitor is charged as an auxiliary voltage source which can be discharged via a transistor to the primary winding of a second transformer. The secondary winding of the second transformer is also connected to the gate-cathode path of the GTO thyristor for feeding-in, via diodes, a negative disconnect current. With this circuit arrangement, the current slope of the control currents is limited by the leakage inductances of both pulse transformers. This leads to difficulties especially in the case of stringent requirements as to the insulation voltage and in the control of high-power semiconductor components.

Another control unit for the potential-separated control of power transistors is known in which the control information, i.e., the command for switching a power transistor on or off with separated potentials, is transmitted by optoelectronic means. The control information drives a pulse amplifier which connects alternatingly two auxiliary voltage sources with opposite polarities to the gate-emitter path of a power transistor. The auxiliary voltage sources, which also supply power to the pulse amplifier, are likewise separated as to potential. Disadvantageously, this type of control unit is a very costly device.

Thus, the problem arises to develop a method and device for potential-separated control of semiconductor power components in such a manner that the cost for the potential-separated transmission of the control power as well as the control information is reduced.

SUMMARY OF THE INVENTION

According to the invention, this problem is obviated by a method for driving a semiconductor power component, comprising the steps of:

a. impressing control information for the component on a pulse sequence containing the control power for the component;

b. transmitting the pulse sequence to the component to drive the component in a manner so as to separate the respective potentials of the control power and control information; and c. recovering the control information from the pulse sequence and delivering the control information to the component.

In the method according to the invention, the control power as well as the control information is transmitted by the same pulse sequence. Therefore, only one insulating path between the control section and the power section of a semiconductor power component is required. A pulse transformer, which can provide the potential-separation transmission, can furthermore be designed for a high insulating voltage and small volume since a large leakage inductance is permissable.

It is of advantage to subject the pulse sequence to pulse-width modulation or pulse-frequency modulation. Pulse-width modulation has been found to be particularly advantageous because it simplifies the circuit design by requiring only a simple demodulator with a lowpass filter followed by a comparator circuit. In addition, it is possible to compensate the load dependence of the control voltages, which occurs because of possible different loads during the "on" and "off" states, by a suitably chosen pulse-to-pause ratio. Further, a reliable switching state can be assigned to the failure of the arrival of the pulse sequence with pulse-width modulation. If, for instance, a smaller pulse-pause ratio is assigned to the "off" state than the "on" state, automatic opening of a connected semiconductor switch can be realized if the pulse sequence is absent.

A device for carrying out the method comprises:

a. means for impressing control information for the component on a pulse sequence containing the control power for the component;

b. means for transmitting the pulse sequence to the component to drive the component and for separating the respective potentials of the control power and control information;

c. means for recovering the control information from the pulse sequence and delivering the control information to the component.

BRIEF DESCRIPTION OF THE DRAWINGS

For a better understanding of the invention, reference is made to the following description of an exemplary embodiment thereof, and to the accompanying drawing, wherein:

FIG. 1 is an electrical schematic diagram of a control section for driving semiconductor power components according to the method of the invention.

DETAILED DESCRIPTION

FIG. 1 shows an electrical circuit diagram of a control section which is operated according to the method of the invention. A pulse transformer 10 has a primary winding 10a and two secondary windings 10b, 10c. The primary winding 10a of the pulse transformer 10 is connected at one end to the emitter of a transistor 12 and at the other end to the positive terminal 13 of a d-c voltage source V. The collector of the transistor 12 is connected to the negative terminal 14 of the d-c voltage source V. The base of the transistor 12 is addressed by a modulating stage 15 which receives control pulses at a control input 15a. The modulating stage 15, which can be used, for instance, in an R-C oscillator, generates a width-modulated pulse sequence having a pulse frequency of about 1 MHz. With pulse-width modulation, the trailing flanks of the individual control pulses are modulated in such a manner that a small pulse pause is assigned to state "1" of the firing signals (corresponding to the command "thyristor on") and a large pulse pause is assigned to state "0" (corresponding to the command "thyristor off").

One end of each secondary winding 10b, 10c (i.e., the tap of each secondary winding) of the pulse transformer 10 is connected, via a respective diode 16, 17, to one end of a respective capacitor 18, 19, each serving as an auxiliary voltage source, and to the collector of a respective transistor 20, 21. The transistors 20, 21 form the pulse amplifier and are tied together in a push-pull arrangement with each base tied to the other and each emitter connected to the gate-cathode path of a GTO thyristor 22. The cathode of the thyristor 22 is connected to the negative terminal of a d-c voltage source $V_1$; to the junction point of the two secondary windings 10b, 10c, which has zero potential; and to the ends of the capacitors 18, 19 not already connected to the windings 10b, 10c. The anode of the thyristor 22 is tied to the positive terminal.

The tap of one of the secondary windings 10b is also tied to a demodulation stage 23 which, in the embodiment example shown, comprises a lowpass filter circuit followed by a comparator circuit. The tap of the one secondary winding 10b is connected to the cathode end of a diode 23a acting as a rectifier which, in turn, is connected at the anode end to one end of a shunt resistor 23b. The anode end of the diode 23 is also connected to the lowpass filter comprising two series-connected resistors 23c, 23d and two shunt-connected capacitors 23 e, 23f. The output of the lowpass filter is connected to a non-inverting input of an operational amplifier 23g. The inverting input of the amplifier 23g is connected to a voltage limit source 23h. The output of the 23g operational amplifier 23g is connected to the control inputs, i.e., the bases, of the pulse amplifier transistors 20, 21. The other ends of the shunt resistor 23b, the shunt-connected capacitors 23 e, 23f and the voltage limit source 23h are tied to the junction point of the two secondary windings 10b, 10c.

In operation, the control input 15a receives a pulse sequence which becomes pulse width-modulated by the modulating stage 15. The pulse sequence is then transmitted by the transformer 10, rectified by the diodes 16, 17 and charges the capacitors 18, 19. The pulse sequence thus serves for transmitting the control power. The control information impressed by the pulse-width modulation is recovered in the demodulation stage 23 which also receives the pulse sequence transmitted by the transformer 10. At the output of the lowpass filter in the demodulation stage 23, a d-c voltage is present, having a magnitude which is proportional to the pulse-pause ratio of the pulse sequence. The threshold voltage, i.e., the voltage from the voltage limit source 23h, is chosen so that it is between the maximum value of the output voltage of the lowpass filter which is assigned to the command "thyristor on" and the minimum value of the output voltage which is assigned to the command "thyristor off". Consequently, a signal at the output of the comparator 23g is produced which is positive for switching on the thyristor 22 and is negative for switching off the thyristor 22. As a result of this signal, the push-pull transistors 20, 21 are driven alternatively and the GTO thyristor 27 is fired and extinguished thereby.

It is to be understood that the embodiment described herein is merely illustrative of the principles of the invention. Various modifications may be made thereto by persons skilled in the art without departing from the spirit and scope of the invention.

What is claimed is:

1. A device for driving a semiconductor power component comprising:
    a. means for impressing the control information for the component on a pulse sequence containing control power for the component;
    b. means for transmitting the pulse sequence from the means for impressing to the component to drive the component and for separating respective potentials of the control power and control information; and
    c. means for recovering the control information from the pulse sequence after the potential-isolated transmission via the means for transmitting and separating and delivering the control information to the component.

2. The device of claim 1, wherein the means for transmitting and separating comprises:
    a. a first controlled switch driven by the means for impressing;
    b. a transformer having a primary winding, which receives the pulse sequence via the first controlled switch, and first and second secondary windings;
    c. means for rectifying the pulse output of the first and second secondary windings;
    d. an auxiliary voltage source which is connected to one of the secondary windings via the means for rectifying; and
    e. a second controlled switch connecting the one secondary winding, via the means for rectifying, and the auxiliary voltage source to the component.

3. The device of claim 2, further comprising:
    a. a second auxiliary voltage source which is connected to the other secondary winding via the means for rectifying; and
    b. a third controlled switch connecting the other secondary winding, via the means for rectifying, and the second auxiliary voltage source to the component.

4. The device of claim 2, wherein the means for impressing comprises a modulation circuit.

5. The device of claim 3, wherein the means for impressing comprises a modulation circuit.

6. The device of claim 4, wherein the means for recovering comprises a demodulation circuit having an input connected to one of the secondary windings of the transformer and which outputs actuating signals corresponding to the control information to the second controlled switch for controlling the driving of the component.

7. The device of claim 5, wherein the means for recovering comprises a demodulation circuit having an input connected to one of the secondary windings of the transformer and which outputs signals corresponding to the control inormation that alternatingly activate the second and third controlled switches so as to control the driving of the component.

8. The device of claim 4, wherein the means for recovering comprises (a) a lowpass filter circuit having an input which is connected to one of the secondary windings of the transformer and (b) a comparator circuit tied to the lowpass filter circuit output and which outputs activating signals corresponding to the control information to the second controlled switch for controlling the driving the component.

9. The device of claim 5, wherein the means for recovering comprises (a) a lowpass filter circuit having an input which is connected to one of the secondary windings of the transformer and (b) a comparator circuit tied to the lowpass filter circuit output and which outputs signals corresponding to the control information that alternatively activate the second and third controlled switches so as to control the driving of the component.

10. A method for driving a semiconductor power component which can be turned on and off comprising the steps of:
   (a) impressing, by modulation, control information for the component on a pulse sequence containing control power for the component;
   (b) transmitting the modulated pulse sequence to the component by means of a transformer;
   (c) rectifying the modulated pulse sequence after potential-isolated transmission by means of the transformer and delivering the control power to the component; and
   (d) demodulating the pulse sequence after potential-isolated transmission by means of the transformer and delivering the control information to the component.

11. The method set forth by claim 10, wherein: the step of impressing further comprises subjecting the pulse sequence to pulse-width modulation.

12. THe method set forth by claim 10, wherein: the step of impressing further comprises subjecting the pulse sequence to pulse-frequency modulation.

* * * * *